(12) United States Patent
Park et al.

(10) Patent No.: US 6,937,518 B1
(45) Date of Patent: Aug. 30, 2005

(54) PROGRAMMING OF A FLASH MEMORY CELL

(75) Inventors: Sheung Hee Park, Pleasanton, CA (US); Wing Han Leung, Sunnyvale, CA (US); Richard M. Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/617,971

(22) Filed: Jul. 10, 2003

(51) Int. Cl.$^7$ .............................................. G11C 16/04
(52) U.S. Cl. ........................... 365/185.18; 365/185.19; 365/185.33
(58) Field of Search ....................... 365/185.05, 185.18, 365/185.19, 185.24, 185.33

(56) References Cited

U.S. PATENT DOCUMENTS

| | | | |
|---|---|---|---|
| 5,553,020 A * | 9/1996 | Keeney et al. ......... | 365/185.19 |
| 5,973,959 A * | 10/1999 | Gerna et al. ........... | 365/185.03 |
| 6,269,023 B1 * | 7/2001 | Derhacobian et al. . | 365/185.03 |
| 6,288,934 B1 * | 9/2001 | Aikawa ................. | 365/185.03 |
| 6,404,679 B1 * | 6/2002 | Guedj ..................... | 35/185.03 |
| 6,714,448 B2 * | 3/2004 | Manea .................. | 365/185.03 |

* cited by examiner

Primary Examiner—Trong Phan

(57) ABSTRACT

A method of programming a memory device comprises applying a first programming voltage to one of a plurality of wordlines, corresponding to a cell to be programmed. The first programming voltage is substantially equal to the desired threshold voltage. A second programming voltage is also applied to one of a plurality of bitlines, corresponding to the cell to be programmed. The second programming voltage gradually increases from a low level toward a high level. The first programming voltage and second programming voltage are removed when the corresponding bitline current begins to decrease.

20 Claims, 10 Drawing Sheets

BITS
- 00 ——————————— $V_{T3} = 7V$
- 01 ——————————— $V_{T2} = 5V$
- 10 ——————————— $V_{T1} = 3V$
- 11 ——————————— MIN $V_T = 1V$

FIGURE 2A
(CONVENTIONAL ART)

BITS
- 000 ——————————— $V_{T7} = 8V$
- 001 ——————————— $V_{T6} = 7V$
- 010 ——————————— $V_{T5} = 6V$
- 011 ——————————— $V_{T4} = 5V$
- 100 ——————————— $V_{T3} = 4V$
- 101 ——————————— $V_{T2} = 3V$
- 110 ——————————— $V_{T1} = 2V$
- 111 ——————————— MIN $V_T = 1V$

FIGURE 2B
(CONVENTIONAL ART)

PROGRAMMING OF A FLASH MEMORY CELL

FIELD OF THE INVENTION

Embodiments of the present invention relate to memory devices, and more particularly to programming a multiple level cell (MLC).

BACKGROUND OF THE INVENTION

As semiconductor memory technology progresses, increasing device density continues to be critical. Increasing device density may be achieved by scaling the memory cell. Alternatively, multiple bits can be store in each memory cell. For example, two bits can be stored in a multiple level cell MLC) utilizing four threshold levels. An un-programmed cell has a minimum threshold value determined by fabrication parameters (e.g., core implant doping level). The minimum threshold value is typically utilized to represent the two-bit combination of '11'; a first threshold value represents the combination '10'; a second threshold value represents the combination '01'; and a third threshold value represents the combination '00'. Similarly, three bits can be stored in a multiple level cell utilizing eight threshold levels, and so on.

Referring to FIG. 1A, a multiple level cell (MLC) 105 according to the conventional art is shown. As depicted in FIG. 1A, the MLC 105 is fabricated about a semiconductor substrate 110. The MLC 105 comprises a source region 115 and a drain region 120. A channel region 125 is disposed between the source region 115 and the drain region 120. A floating gate 130 is formed above the channel region 125. A first isolating layer 135 is disposed between the floating gate 130 and the channel region 125. A control gate 140 is formed above the floating gate 130. A second isolating layer 145 is disposed between the control gate 140 and the floating gate 130.

The voltage on the control gate 140 must first exceed a threshold voltage before appreciable current flows between the source and drain regions. Thereafter, the current is specified by the following equation:

$$I = K/L(V_G - V_T)$$

Where K is a constant, L is the channel length of the MLC, $V_G$ is the voltage on the control gate 140, and $V_T$ is the threshold voltage. From the above equation it is appreciated that the current is proportional to the voltage on the control gate 140 less the threshold voltage. Hence, the state of one or more bits can be represented by adjusting the threshold voltage level. The threshold voltage can be adjusted by injecting charge onto the floating gate 130. The state of the bits are then determined by the magnitude of the current flowing between the source region 115 and the drain region 120.

Typically, reading the MLC 105 entails applying a positive voltage (e.g., 5 Volts (V)) to the control gate 140, and a positive voltage (e.g., 1V) to the drain region 120. The source region 115 and substrate 110 are grounded. The drain current is then compared to a plurality of reference currents to determine the state of the MLC 105.

Erasing the MLC 105, in one configuration, entails applying a positive voltage (e.g., 5V) to the source region 115, a negative voltage (e.g., −10V) to the control gate 140, and tri-stating (e.g., high impedance) the drain region 120. The large potential difference between the control gate 140 (e.g., −10V) and the source region 115 (e.g., 5V) causes electrons trapped on the floating gate 130 to be repelled by the control gate 140 and attracted by the source region 115. The electrons tunnel from the control gate 130 through the first insulating layer 135 to the source 115.

In another configuration, erasing the MLC 105 entails applying a large positive voltage (e.g., 10V) to the source region 115, grounding the control gate 140, and tri-stating (e.g., high impedance) the drain region 120. The large potential difference between the control gate 140 (e.g., 0V) and the source region 115 (e.g., 10V) causes electrons trapped on the floating gate 130 to be attracted by the source region 115. The electrons tunnel from the control gate 130 through the first insulating layer 135 to the source region 115.

Programming the MLC 105 typically entails applying a positive voltage (e.g., 8.5V) to the control gate 140, a positive voltage (e.g., 5V) to the drain region 120, while grounding the source region 115 and substrate 110. The potential difference between drain region 120 and source region 115, causes electrons to flow across the channel from the source region 115 (e.g., 0V) toward the drain region (e.g., 5V). The high voltage applied to the control gate 140 causes some electrons to overcome the potential barrier of the first insulating layer 135. Thus, electrons are injected into the floating gate 130. The injected electrons on the floating gate 130 act to increase the threshold voltage of the MLC 105. The amount of injected electrons on the floating gate 130 determines the value of the threshold voltage.

In order to program multiple bits on a single cell, multiple threshold levels must be programmed. Referring now to FIG. 2A, a graphical representation of the correlation between the state of two bits and four threshold levels, according to the conventional art, is shown. As depicted in FIG. 2A, the bit combination of '11' is represented by an un-programmed cell (e.g., $V_T = V_{T\,MIN} = 1V$). The bit combination of '10' is represented by a first threshold voltage, $V_{T1}$ ($V_{T1} = 1V$). The bit combination of 01 is represented by a second threshold voltage, $V_{T2}$ ($V_{T2} = 5V$). The bit combination of '00' is represented by a third threshold voltage, $V_{T3}$ ($V_{T3} = 7V$). The plurality of threshold voltage levels are spread out between the minimum threshold voltage and the maximum threshold voltage that can be programmed and erased for a given memory device.

Referring now to FIG. 2B, a graphical representation of the correlation between the state of three bits and eight threshold levels, according to the conventional art, is shown. As depicted in FIG. 2B, the bit combination of '111' is represented by an un-programmed cell (e.g., $V_T = V_{T\,MIN} = 1V$). The bit combinations of '110'-'000' are represented by the respective threshold voltages, $V_{T1}$-$V_{T7}$ (e.g., $V_{T1} = 2V$, $V_{T2} = 3V$, $V_{T3} = 4V$, $V_{T4} = 5V$, $V_{T5} = 6V$, $V_{T6} = 7V$, and $V_{T7} = 8V$).

The multiple threshold levels can be provided for by adjusting the length of time that the programming voltages are applied to the cell. However, manufacturing process variations result in some cells programming faster than other cells. A fast cell will have a higher threshold voltage than a slow cell, for a given programming period. Similarly, variations in the actual voltage levels used for programming will result in some cells being programmed faster than other cells. As a result, the threshold cannot be set perfectly. Therefore, each threshold voltage will have a statistical distribution.

Referring now to FIG. 3, a graphical representation of the statistical deviation of multiple programmed threshold voltage levels according to the conventional art is shown. As depicted in FIG. 3, a multiplicity of desired threshold voltages (e.g., $V_T$=1V, 3V, 5V, 7V; and $V_T$=$V_{T\ MIN}$=1V) are shown. Each actual programmed threshold value will have a certain distribution 305, between a plurality of cells of a memory device. However, to ensure reliable operation of the memory device, the distribution 305 of a given threshold level must be separated from the next higher or lower threshold voltage level by a specified margin 310. The larger the deviation of a given threshold voltage level, the smaller the margin 310 is between adjacent threshold levels. Therefore, the distribution 305 in programming a desired threshold value needs to be minimized. However, simply controlling the length of time that programming voltages are applied to the cell does not provide sufficient control of the distribution 305 of threshold values, to provide reliable operation of the memory device.

One solution, according to the conventional art, is to apply a plurality of short programming pulses and performing a verify cycle between each programming pulse. Referring now to FIG. 4, a method of programming a MLC according to the conventional art is shown. As depicted in FIG. 4, the process begins with applying a programming pulse, at step 410. For example, an 8.5V pules is applied to a control gate, a 5V pulse is applied to a drain, while grounding a source and substrate of the MLC. The length of the pulse is some fraction (e.g., $\frac{1}{20}^{th}$) of the average time required to program a first threshold value.

Next at step 415, a program verify is performed after application of each program pulse. The program verify typically comprises reading the memory cell. For example, 5V is applied to the control gate, 1V is applied to the drain region, while the source region and substrate are grounded. The drain current is then compared to a reference current corresponding to the desired threshold voltage.

Next at step 420, if the drain current is less than the reference current, another program pulse is applied followed by another program verify. Additional programming pulses and program verify steps are performed until the drain current is substantially equal to the reference current corresponding to the desired threshold voltage. When the drain current is substantially equal to the reference current, the programming of the cell is complete.

Referring now to FIG. 5, a timing diagram of gate, drain, and threshold voltages in a MLC being programmed, according to the conventional art is shown. As depicted in FIG. 5, a threshold voltage 505 (e.g., Vt2=5V) of a MLC is programmed. The threshold voltage 505 gradually rises from a minimum threshold voltage (e.g., $V_{T\ MIN}$=1V) to threshold voltage 505 (e.g., Vt2=5V). A series of voltage pulses 510 (e.g., Vg=8.5V) are applied to a gate, while another series of voltage pulses 515 (e.g., 5V) are applied to a drain of the MLC. Between each set of voltage pulses 520, 525, a verify process 530 is performed to determine the current threshold level.

Each set of voltage pulse 520, 525 increases the threshold voltage 505 by a fraction of the total desired threshold voltage. A fast programming MLC will reach the same threshold voltage 505 with fewer pulses 520, 525. A slower programming MLC will require more programming pulses 520, 525 to reach the same threshold voltage 505. By utilizing multiple sets of voltage pulses 520, 525, the variation in threshold voltages 505 between cells will be less than or equal to the incremental increase resulting from one set of voltage pulses 520. Therefore, reducing the width of the voltage pulse 520 reduces variations in the threshold voltage levels 505.

The multiple programming pulse method is disadvantageous in that the method results in a relatively long total programming time. The program verify takes a longer period of time than a programming pulse. Hence, every program verify significantly increases the total programming time. Furthermore, setup time between a programming pulse and a verify cycle and between the verify cycle and the next programming pulse is also incurred.

SUMMARY OF THE INVENTION

A novel method of programming a multiple level cell (MLC) is disclosed. In one embodiment, the method comprises applying a gate voltage having one of a plurality of levels, while applying a ramped drain voltage. Each of the plurality of gate voltage levels correspond to one of a plurality of threshold voltages. The plurality of threshold voltages are utilized to represent a plurality of bit combinations. The programming voltages applied to the gate and drain are removed when a drain current decreases. As a result, the present invention advantageously reduces the programming time while providing for programming of multiple threshold levels having relatively small distributions. The present invention is also advantageous in that reliability of the cell is increased, as compared to the convention art methods of programming.

BRIEF DESCRIPTION OF THE DRAWINGS

The present invention is illustrated by way of example and not by way of limitation, in the figures of the accompanying drawings and in which like reference numerals refer to similar elements and in which:

FIG. 2A shows a graphical representation of the correlation between the state of two bits and four threshold levels, according to the conventional art.

FIG. 2B shows a graphical representation of the correlation between the state of three bits and eight threshold levels, according to the conventional art.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1A:
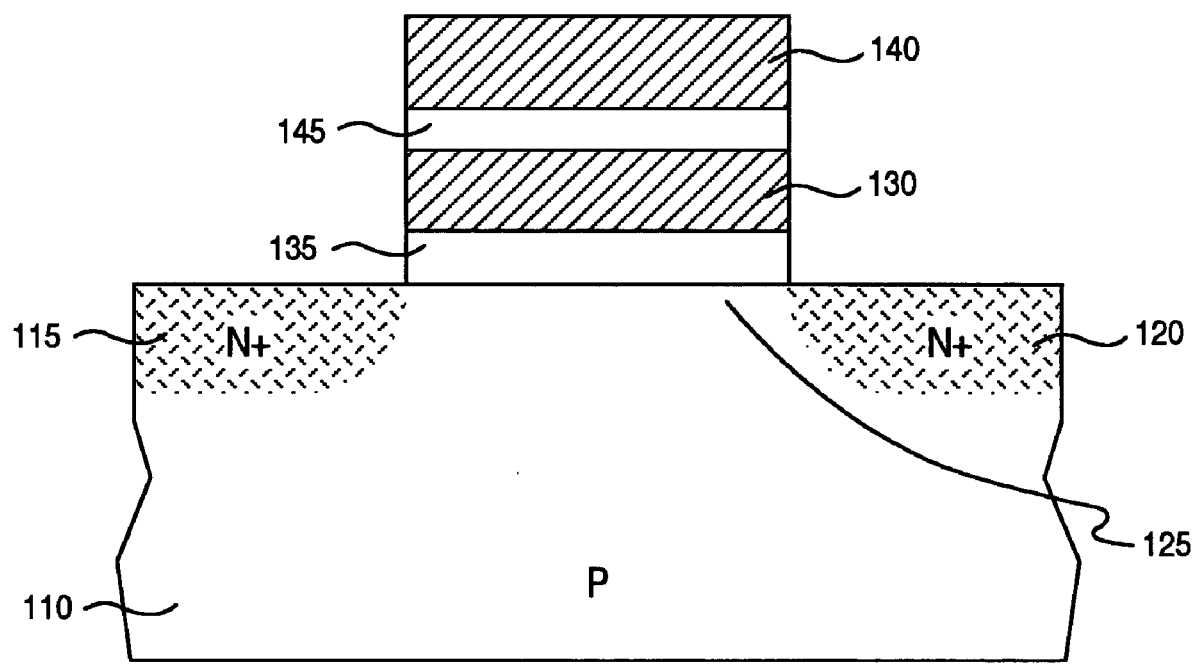
FIG. 1A shows a multiple level cell (MLC) according to the conventional art.
Figure 3:
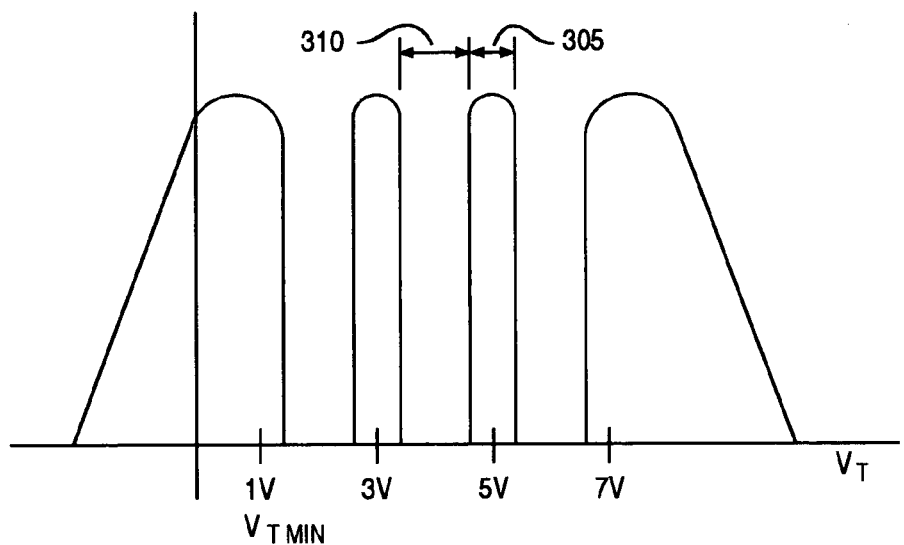
FIG. 3 shows a graphical representation of the statistical deviation of multiple programmed threshold voltage levels according to the conventional art.
Figure 4:
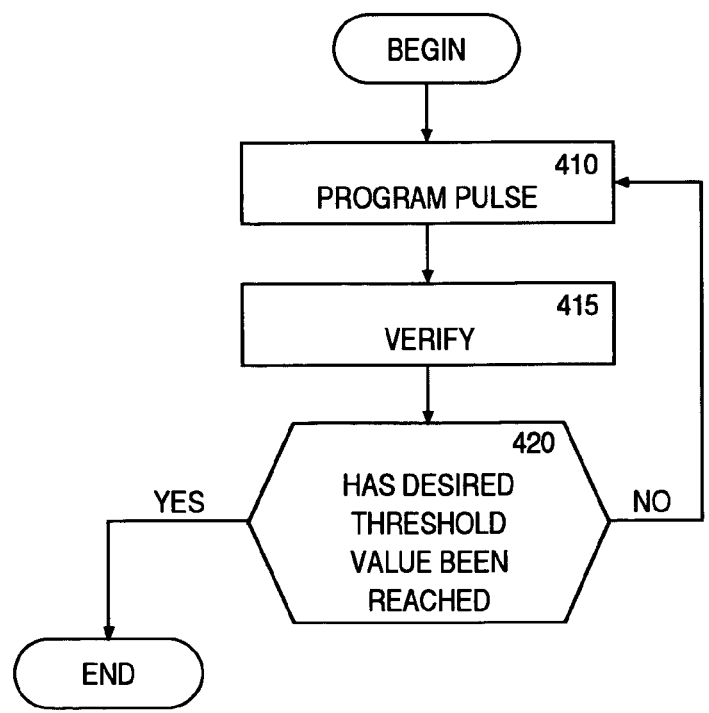
FIG. 4 shows a method of programming a MLC according to the conventional art.
Figure 5:
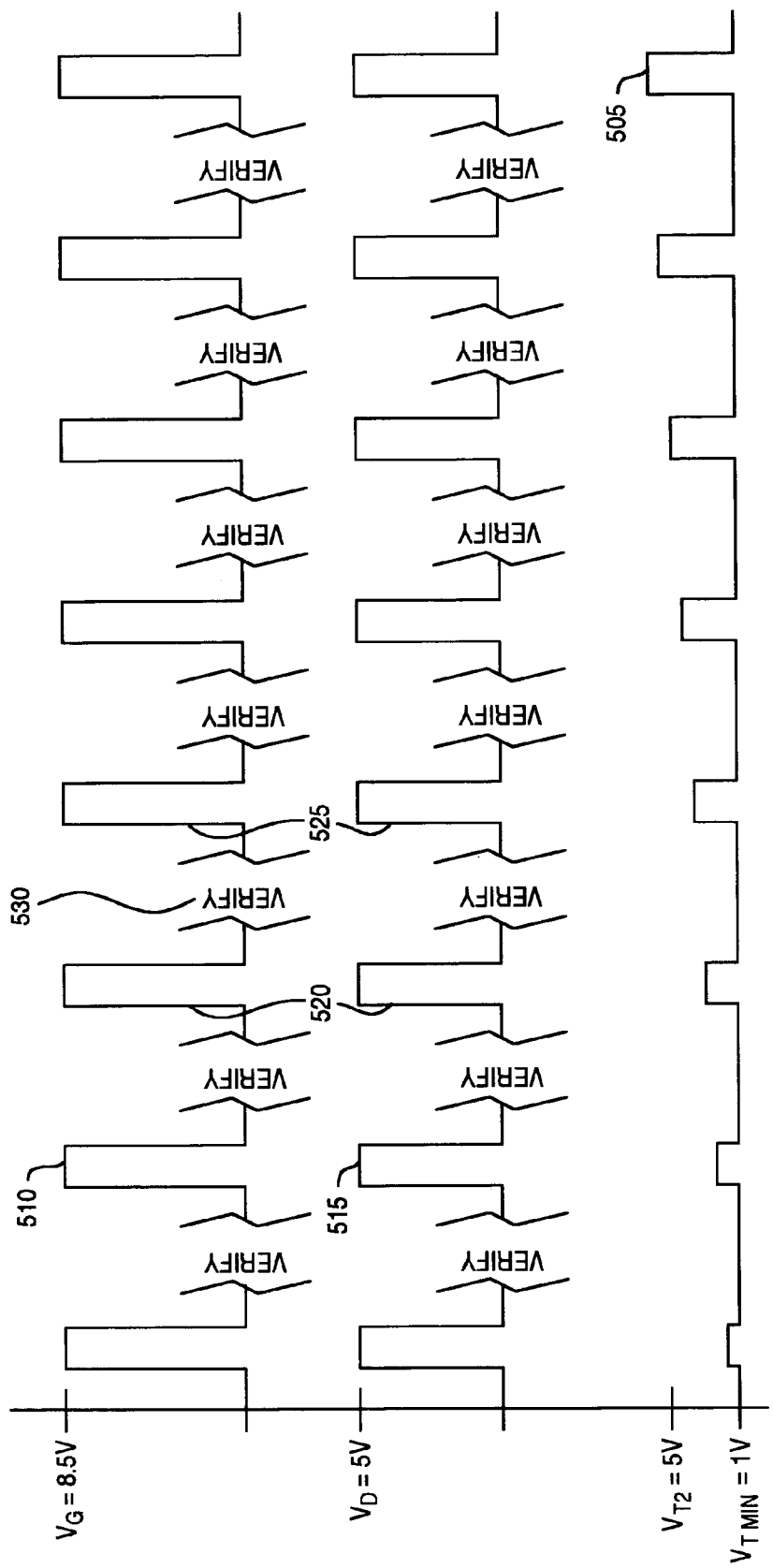
FIG. 5 shows a timing diagram of gate, drain, and threshold voltages in a MLC being programmed, according to the conventional art.
Figure 6:
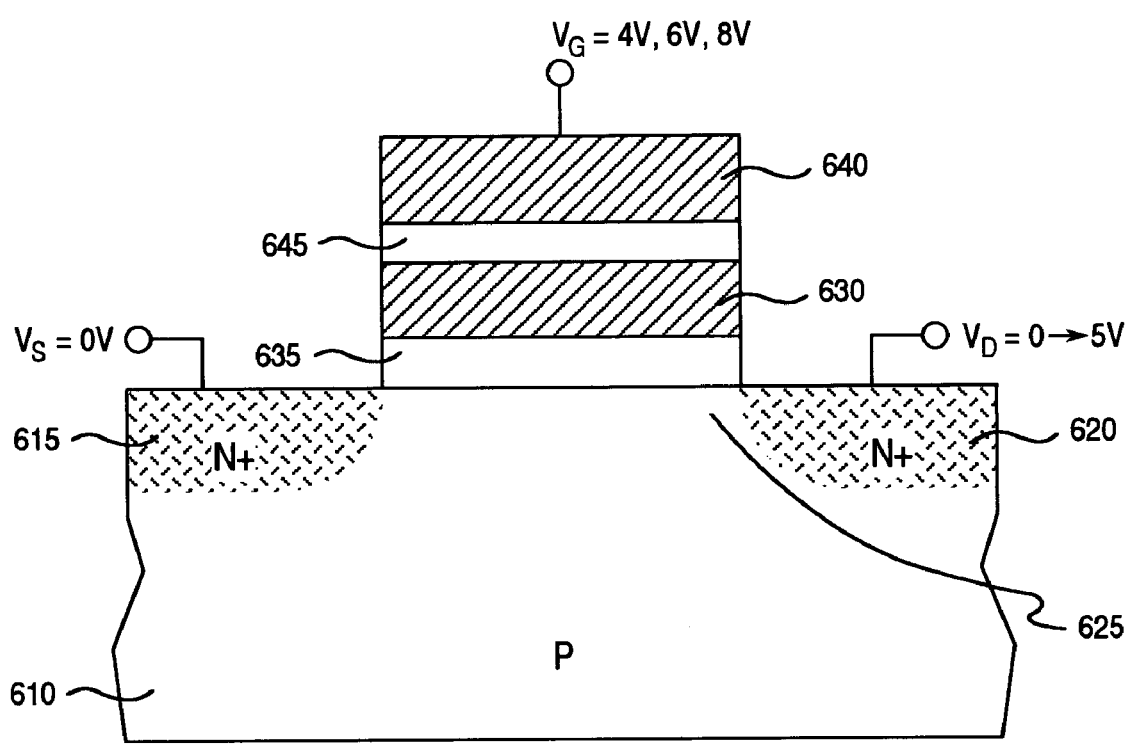
FIG. 6 shows a MLC, in accordance with one embodiment of the present invention.

Referring now to FIG. 6, a multiple level cell (MLC) 605, in accordance with one embodiment of the present invention is shown. As depicted in FIG. 5, the MLC 605 is fabricated about a semiconductor substrate 610. The MLC 605 comprises a source region 615 and a drain region 620. A channel region 625 is disposed between the source region 615 and the drain region 620. A floating gate 630 is formed above the channel region 625. A first isolating layer 635 is disposed between the floating gate 630 and the channel region 625. A control gate 640 is formed above the floating gate 630. A second isolating layer 645 is disposed between the control gate 640 and the floating gate 630.

The MLC 605 is programmed by applying a positive voltage to the control gate 640 and a positive ramped voltage to the drain region 620, while grounding the source region 615 and the substrate 610. The potential difference between the drain region 620 and the source region 615, causes electrons to flow across the channel 625 from the source 615 toward the drain 620. The voltage applied to the control gate 640 causes some electrons to overcome the potential barrier of the first insulating layer 635. Thus, electrons are injected into the floating gate 630. The injected electrons on the floating gate act to increase the threshold voltage of the MLC.

In an exemplary implementation, a first gate voltage (e.g., $V_G=4V$) is applied along with a ramped drain voltage to program a first threshold voltage level (e.g., $V_T=3V$). A source voltage (e.g., $V_S=0V$) is also applied. The ramped drain voltage increases from a first level (e.g., 0V) toward a second level (e.g., 5V) over a period of time. When the drain current begins to decrease the first gate voltage and ramped drain voltage are removed (e.g., $V_G=0V$, $V_D=0V$). As a result, the threshold voltage is readily set to the desired level (e.g., $V_T=3V$).

A second gate voltage (e.g., $V_G=6V$) is applied along with the ramped drain voltage to program a second threshold voltage level (e.g., $V_T=5V$). The ramped drain voltage increases from a first level (e.g., 0V) toward a second level (e.g., 5V) over a period of time. When the drain current begins to decrease, the second gate voltage and ramped drain voltage are removed (e.g., $V_G=0V$, $V_D=0V$). As a result, the threshold voltage is readily set to the desired level (e.g., $V_T=5V$).

A third gate voltage (e.g., $V_G=8V$) is applied along with a ramped drain voltage to program a third threshold voltage level (e.g., $V_T=7V$). The ramped drain voltage increases from a first level (e.g., 0V) toward a second level (e.g., 5V) over a period of time. When the drain current begins to decrease the third gate voltage and ramped drain voltage are removed (e.g., $V_G=0V$, $V_D=0V$). As a result, the threshold voltage is readily set to the desired level (e.g., $V_T=7V$).

In an exemplary implementation, the first threshold value represent the bit combination of '10', the second threshold value represent the bit combination of '01', and the third threshold value represents the bit combination of '00'. The bit combination of '11' is represented by the minimum threshold voltage (e.g., an un-programmed state).

Figure 7:
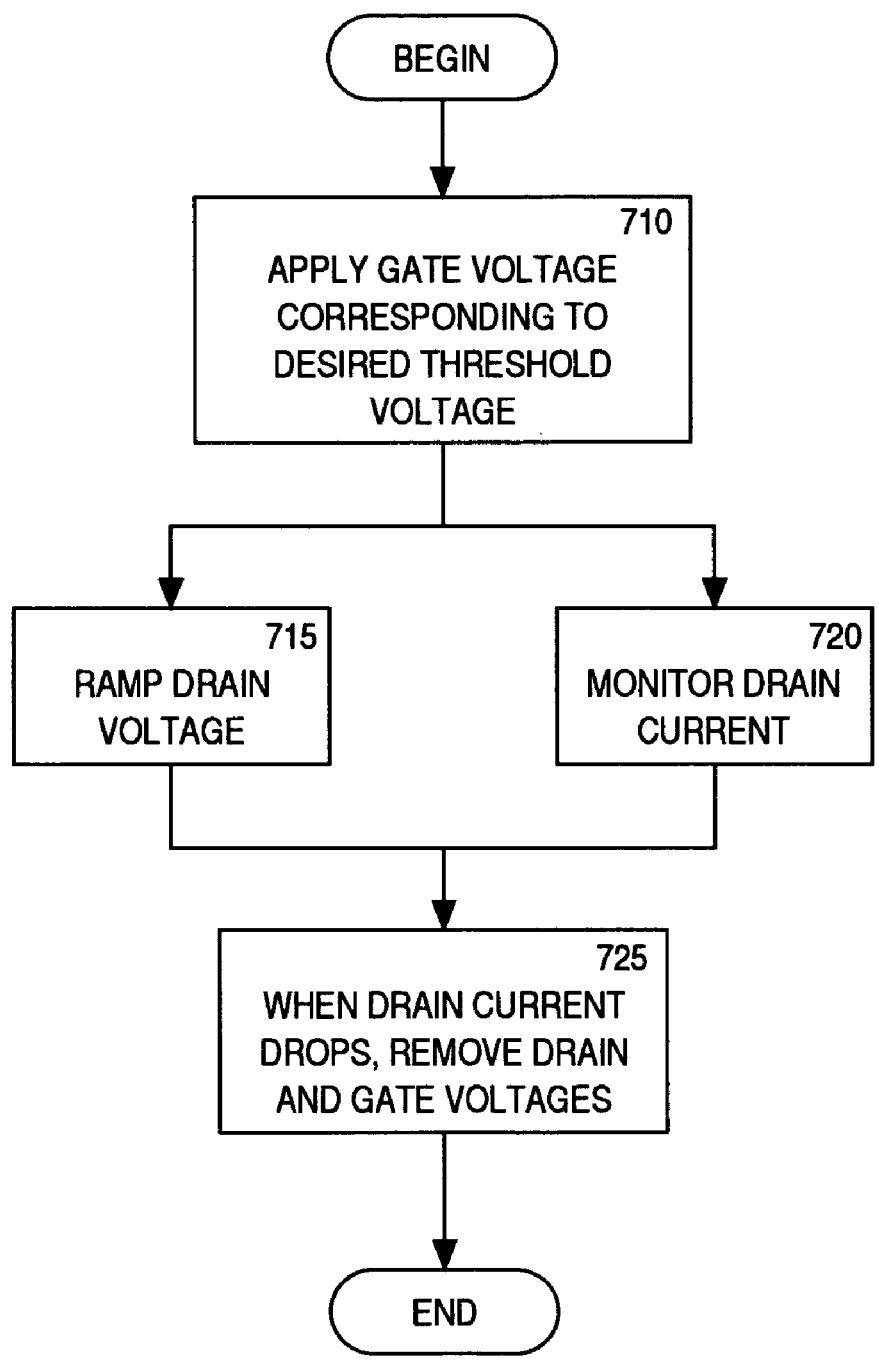
FIG. 7 shows a flow diagram of a method of programming a MLC, in accordance with one embodiment of the present invention.

Referring to FIG. 7, a flow diagram of a method of programming a MLC, in accordance with one embodiment of the present invention, is shown. As depicted in FIG. 7, the process begins with applying a gate voltage corresponding to a desired threshold, at step 710. The voltage to be applied to the control gate is determined by adding the minimum threshold voltage value to the corresponding desired threshold voltage to be programmed. In an exemplary implementation, if the minimum threshold voltage is approximately 1V and a threshold voltage of 3V is desired, a gate voltage of 4V is applied. If a threshold voltage of 5V is desired, a gate voltage of 6V is applied. If a threshold voltage of 7V is desired, a gate voltage of 8V is applied.

Next at step 715, the drain voltage is gradually increased from a first level to a second level (e.g., ramped). In an exemplary implementation, the drain voltage is gradually increased from 0V toward a maximum drain voltage (e.g., 5V), which will not appreciably damage the MLC. In another implementation, the drain voltage is gradually increased from the minimum threshold voltage toward a maximum drain voltage, which will not appreciably damage the MLC.

While the drain voltage is increasing, the drain current is monitored, at step 720. At step 725, the applied gate voltage and drain voltage are removed when the drain current decreaseS. In another implementation, the applied gate voltage and drain voltages are removed when the drain current decreases below a specified level.

Figure 8A:
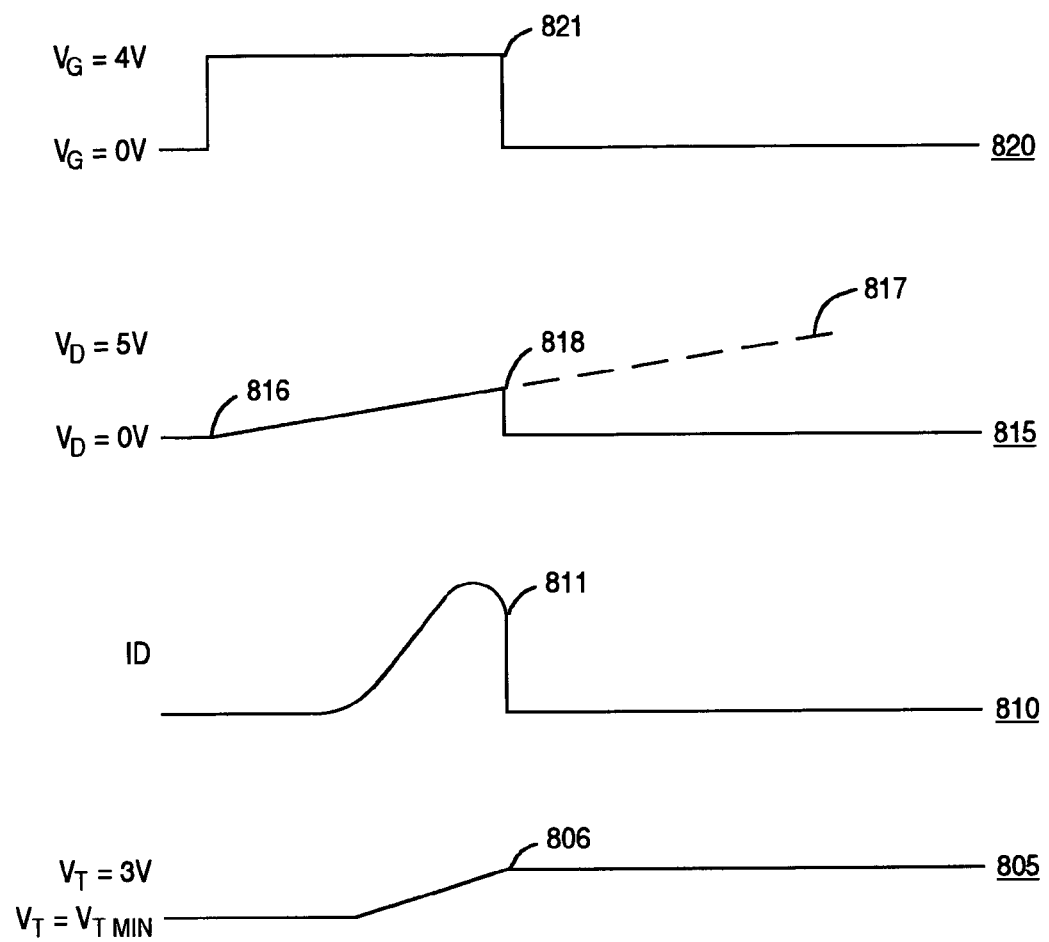
FIGS. 8A, 8B and 8C show timing diagrams of gate, drain and threshold voltages and drain current in a MLC being programmed, in accordance with one embodiment of the present invention.
Figure 8B:
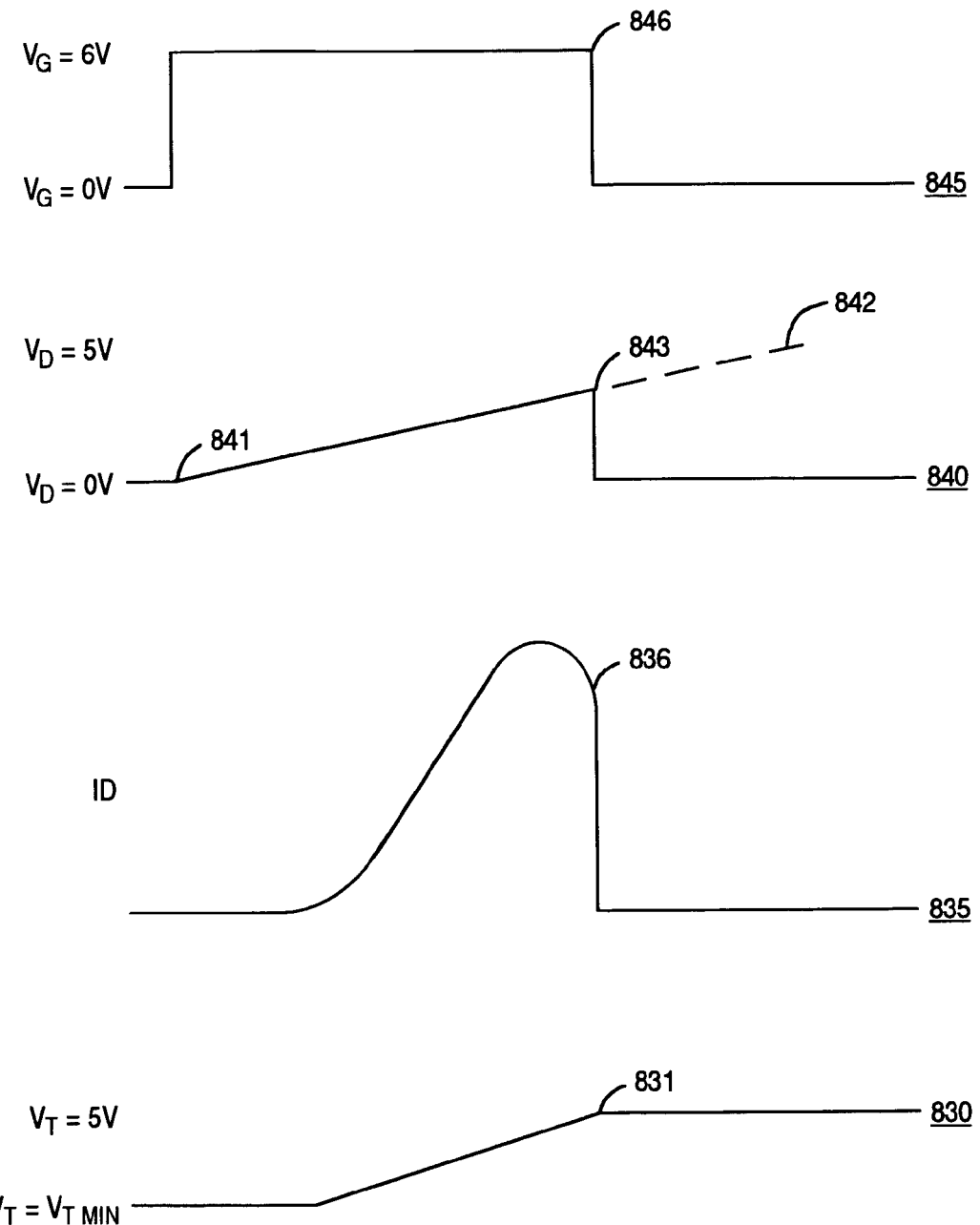
Figure 8C:
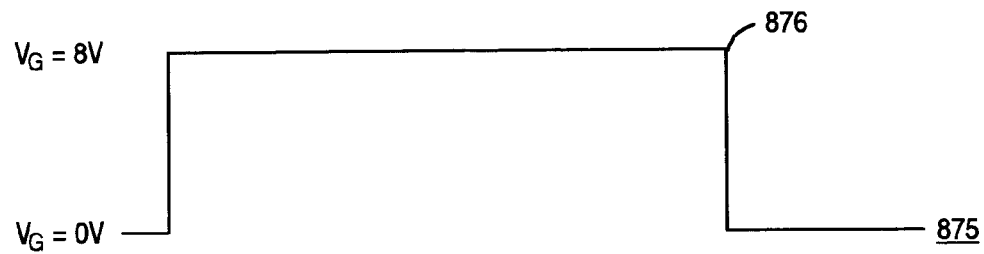
Figure 8C:
Figure 8C:
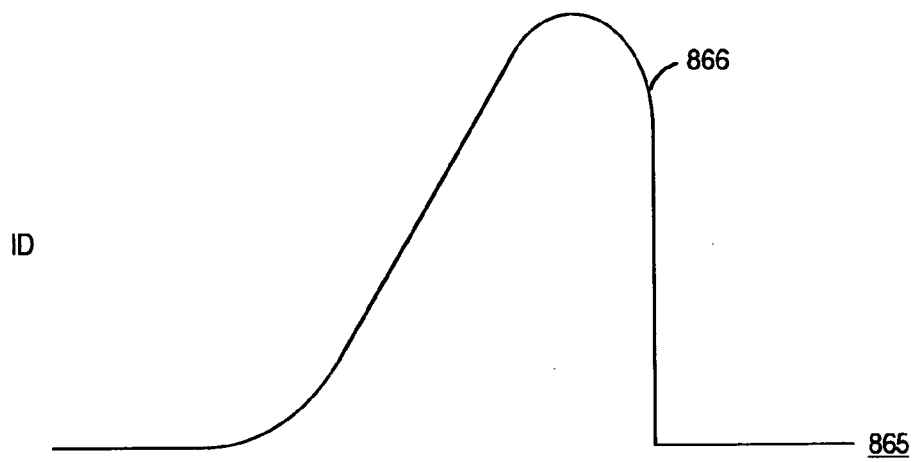
Figure 8C:
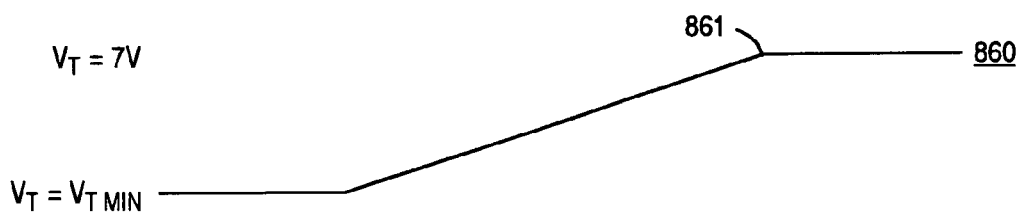

Referring now to FIGS. 8A, 8B and 8C, timing diagrams of gate, drain and threshold voltages and drain current in a MLC being programmed, in accordance with one embodiment of the present invention, are shown. As depicted in FIG. 8A, a first threshold voltage 805 (e.g., $V_T=3V$) is programmed by applying a first gate voltage 820 (e.g., $V_G=4V$) along with a ramped drain voltage 815. The ramped drain voltage 815 increases from a first level 816 (e.g., 0V) toward a second level 817 (e.g., 5V) over a period of time. The drain current 810 rapidly increases as the drain voltage 815 increases. The drain current 810 then begins to decrease 811 when the threshold voltage 805 reaches the desired level 806 (e.g., $V_T=3V$). The drain current 810 decreases as a result of the increasing threshold voltage 805 from $V_T=V_{T\ MIN}$ to $V_T=3V$ effectively blocking the gate voltage 820 from inducing a conducting channel in the MLC. When the drain current 810 begins to decrease 811, the first gate voltage 820 and first drain voltage 815 are removed 818, 821 (e.g., $V_G=0V$, $V_D=0V$). As a result, the threshold voltage 805 is programmed to the level of voltage present on the gate (e.g., 4V) minus the minimum threshold voltage (e.g., $V_{T\ MIN}=1V$).

As depicted in FIG. 8B, a second threshold voltage 830 (e.g., $V_T=5V$) is programmed by applying a second gate voltage 845 (e.g. $V_G=6V$) at a level 846 along with a ramped drain voltage 840. The ramped drain voltage 840 increases from a first level 841 (e.g., $V_D=0V$) toward a second level 842 (e.g., $V_D=5V$) over a period of time, and drops at 843. The drain current 835 rapidly increases as the drain voltage increases 840. The drain current 835 then begins to decrease 836 when the threshold voltage 830 reaches the desired level (e.g., $V_T=5V$) 831. The drain current 835 decreases as a result of the increasing threshold voltage 830 effectively blocking the gate voltage 845 from inducing a conducting channel in the MLC. When the drain current 835 begins to decrease 836, the second gate voltage 845 and first drain voltage 840 are removed 843, 846 (e.g., $V_G=0V$, $V_D=0V$). As a result, the threshold voltage 830 is programmed to the level of voltage present on the gate (e.g., 6V) minus the minimum threshold voltage (e.g., $V_T=V_{T\ MIN}=1V$) at level 831.

As depicted in FIG. 8C, a third threshold voltage 860 (e.g., $V_T=7V$) is programmed by applying a third gate voltage 875 (e.g. $V_G=8V$) along with a ramped drain voltage 870. The ramped drain voltage 870 increases from a first level 871 (e.g., 0V) toward a second level 872 (e.g., 5V) over a period of time. The drain current 865 rapidly increases as the drain voltage increases 870. The drain current 865 then begins to decrease 866 when the threshold voltage 860 reaches the desired level 861 (e.g., $V_T=7V$). The drain current 865 decreases as a result of the increasing threshold voltage 860 effectively blocking the gate voltage 875 from inducing a conducting channel in the MLC. When the drain current 865 begins to decrease 866, the third gate voltage and first drain voltage are removed 873, 876 (e.g., $V_G=0V$, $V_D=0V$). As a result, the threshold voltage 860 is programmed to the level of voltage present on the gate (e.g., 8V) minus the minimum threshold voltage (e.g., $V_T=V_{T\ MIN}=1V$).

Figure 9:
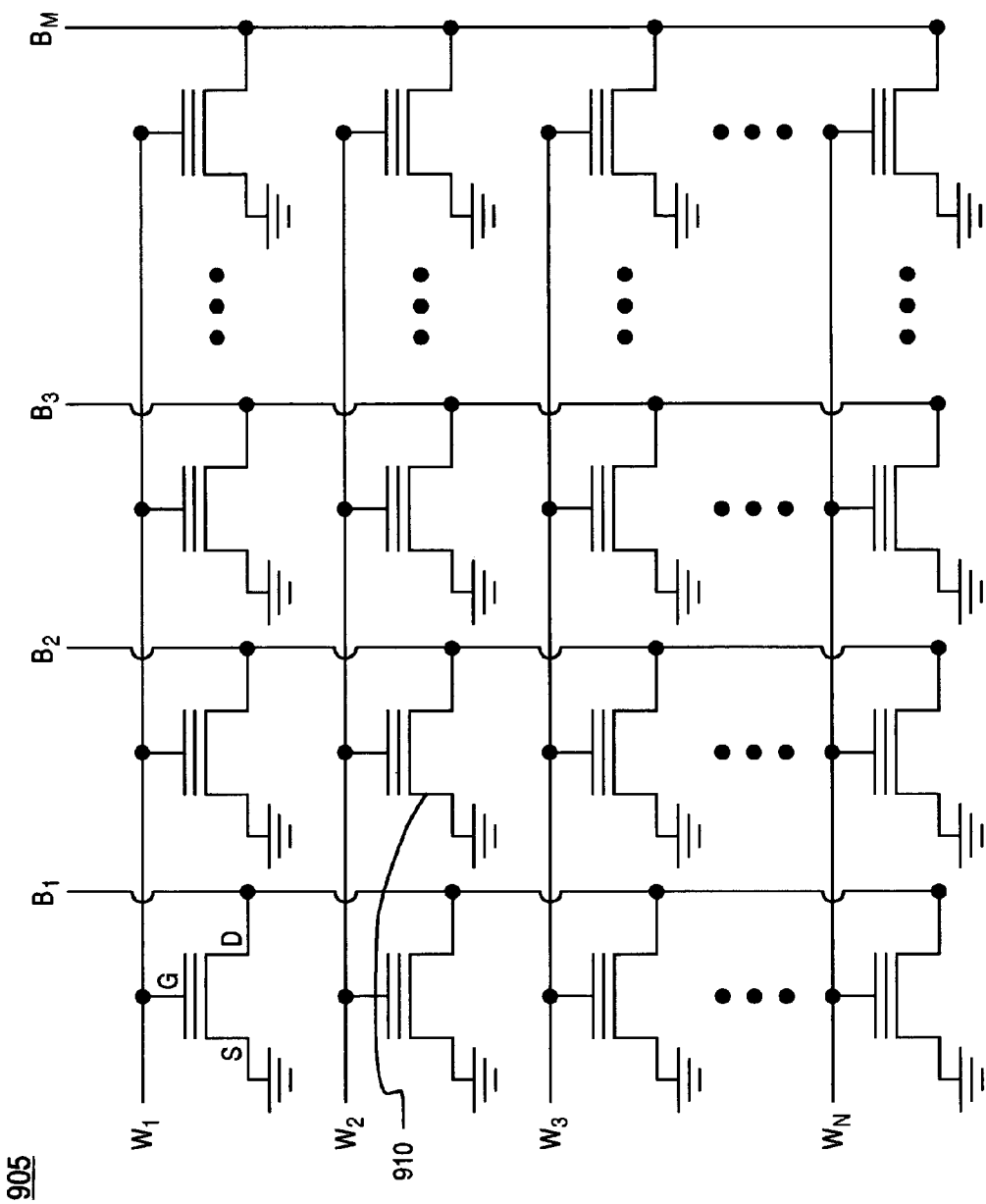
FIG. 9 shows a memory device, in accordance with one embodiment of the present invention.

Referring now to FIG. 9, a memory device 905, in accordance with one embodiment of the present invention, is shown. In one implementation the memory device 905 comprises a flash memory. As depicted in FIG. 9, the memory device 905 comprises a plurality of floating gate memory cells 910 arranged in columns and rows. Each cell 910 comprises a floating gate, a control gate (G), a drain (D), and a source (S).

The control gate of each cell 910 in a row is coupled to one of N corresponding wordlines ($W_1, W_2, W_3, \ldots W_N$). The drain of each cell 910 in a column is coupled to one of M bitlines ($B_1, B_2, B_3, \ldots B_M$). The source of each cell 910 is coupled in common with each other. Alternatively, the sources, for a particular block, sector, or other subdivision of the entire array, may be coupled in common with each other. In yet another configurations, the source of each cell 910 in a column is coupled to one of M sub-bitlines.

The process of programming a particular cell 910 begins with an initial erase cycle so that the threshold voltage of the cell is substantially $V_{T\ MIN}$. In an exemplary implementation, the wordline (e.g., W2) corresponding to the cell 910 to be erased is biased at 20V. The bitline (e.g., B2) corresponding to the cell 910 to be erased is biased at 0V.

The process then proceeds with a program cycle, such that the threshold voltage of the particular cell 910 is set to a desired level. The cell 910 is programmed by applying a first programming voltage to the corresponding wordline (e.g. W2). In an exemplary implementation, if a threshold voltage of 3 volts (V) is desired, a wordline programming voltage of 4V is applied. If a threshold voltage of 5V is desired, a wordline programming voltage of 6V is applied. If a threshold voltage of 7V is desired, a wordline programming voltage of 8V is applied.

A second programming voltage is also applied to the corresponding bitline (e.g., B2). In an exemplary implementation, the bitline programming voltage is gradually increased from a first level (e.g., 0V) toward a second level (e.g., 5V). In another implementation, the bitline programming voltage is increased from the minimum threshold voltage (e.g., 1V) toward a second level (e.g., 5V) at a rate such that the bitline voltage would reach the second level in a specified period of time.

While the bitline programming voltage is increasing, the current on the bitline is monitored. When the current on the bitline decreases the wordline programming voltage and bitline programming voltage are removed. In another implementation, the applied wordline programming voltage and bitline programming voltage are removed when the current on the bitline decreases below a specified level. The resulting threshold value will be approximately equal to the bitline programming voltage minus the minimum threshold voltage.

Embodiments of the present invention advantageously reduce the programming time while providing for programming of multiple threshold levels having relatively small deviations. Embodiments of the present invention advantageously eliminate the multiple verify cycles and setup times between programming pulses and verify cycles. Instead of utilizing a verify cycle, embodiment of the present invention apply a gate voltage level corresponding to the desired threshold voltage level and monitor the drain current to detect when the threshold level has been programmed to the desired level.

Embodiments of the present invention are also advantageous in that reliability of the cell is increased, as compared to the convention art methods of programming. Reliability of the cell is increased by reducing the maximum voltage applied to the cell during programming. Embodiments of the present invention apply a ramped drain voltage, which is removed when the cell has been programmed as determined by monitoring the drain current. Therefore, the drain voltage does not regularly reach the maximum drain voltage.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of programming a multiple level cell comprising:

applying a gate voltage approximately equal to a desired threshold voltage plus a minimum threshold value;

applying a drain voltage, wherein said drain voltage gradually increases from a first level toward a second level; and removing said drain voltage, when a drain current decreases.

2. The method according to claim 1, further comprising removing said gate voltage, when said drain current decreases.

3. The method according to claim 1, wherein said removing said drain voltage when said drain current decreases is adapted to reduce a distribution of said desired threshold voltage.

4. The method according to claim 1, wherein said removing said drain voltage when said drain current decreases is adapted to increase a programming reliability of said memory cell.

5. The method according to claim 1, wherein said multiple level cell is programmed to said desired threshold value when said drain current decreases.

6. A method of programming a memory device comprising:
a) applying a first programming voltage to one of a plurality of wordlines corresponding to a cell to be programmed, wherein said first programming voltage corresponds to a desired threshold voltage;
b) applying a second programming voltage to one of a plurality of bitlines corresponding to said cell to be programmed, wherein said second voltage gradually increases from a low level toward a high level;
c) monitoring a current on said one of said plurality of bitlines;
d) removing said first programming voltage when said current begins to decrease; and
e) removing said second programming voltage when said current begins to decrease.

7. The method according to claim 6, wherein said memory device comprises a flash memory.

8. The method according to claim 6, wherein said monitoring said current is adapted to reduce a distribution of said desired threshold voltage.

9. The method according to claim 6, wherein said monitoring said current is adapted to increase a margin between said desired threshold voltage and an adjacent threshold voltage.

10. The method according to claim 6, wherein said monitoring said current is adapted to increase a programming reliability of said memory cell.

11. A memory cell for storing a plurality of bits comprising:
a control gate, wherein one of a plurality of first programming voltages is applied until a drain current drops below a reference level;
a drain, wherein a ramped programming voltage is applied until said drain current drops below said reference level; and
a floating gate, wherein each of said plurality of first programming voltages causes a corresponding one of a plurality of levels of charge to be stored on said floating gate, and wherein each of said plurality of levels of charge represent one of a plurality of combinations of said plurality of bits.

12. The memory cell for storing a plurality of bits according to claim 11, wherein said ramped programming voltage comprises a gradually increasing voltage.

13. The memory cell for storing a plurality of bits according to claim 11, further comprising:
a source;
a channel disposed between said drain and said source; and
wherein said floating gate is disposed between said control gate and said channel.

14. The memory cell for storing a plurality of bits according to claim 11, wherein said plurality of bits comprises two bits.

15. The memory cell for storing a plurality of bits according to claim 14, wherein said plurality of levels of charge comprises four levels of charge.

16. The memory cell for storing a plurality of bits according to claim 11, wherein said plurality of bits comprises three bits.

17. The memory cell for storing a plurality of bits according to claim 16, wherein said plurality of levels of charge comprises eight levels of charge.

18. The memory cell for storing a plurality of bits according to claim 11, wherein applying said ramped programming voltage until said drain current drops below said reference level is adapted to increase a programming reliability of said memory cell.

19. The memory cell for storing a plurality of bits according to claim 11, wherein applying said ramped programming voltage until said drain current drops below said reference level is adapted to reduce a programming time.

20. The memory cell for storing a plurality of bits according to claim 11, wherein applying said ramped programming voltage until said drain current drops below said reference level is adapted reduce a programming damage to said memory cell.

* * * * *